(12) United States Patent
Kwak et al.

(10) Patent No.: US 8,339,877 B2
(45) Date of Patent: Dec. 25, 2012

(54) SEMICONDUCTOR MEMORY DEVICE COMPRISING VARIABLE DELAY UNIT

(75) Inventors: Sang-Hyup Kwak, Seoul (KR);
Seung-Jun Bae, Hwaseong-si (KR);
Young-Sik Kim, Gunpo-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 325 days.

(21) Appl. No.: 12/764,460

(22) Filed: Apr. 21, 2010

(65) Prior Publication Data

US 2010/0271887 A1    Oct. 28, 2010

(30) Foreign Application Priority Data

Apr. 24, 2009    (KR) .................... 10-2009-0036037

(51) Int. Cl.
*G11C 7/00* (2006.01)
(52) U.S. Cl. .................... 365/194; 365/191; 365/201
(58) Field of Classification Search .................. 365/191, 365/194, 201
See application file for complete search history.

(56) References Cited

U.S. PATENT DOCUMENTS

| | | | | |
|---|---|---|---|---|
| 5,867,446 | A * | 2/1999 | Konishi et al. | 365/233.16 |
| 6,574,154 | B2 * | 6/2003 | Sato et al. | 365/198 |
| 2009/0129179 | A1 * | 5/2009 | Yamazaki | 365/194 |
| 2009/0154256 | A1 * | 6/2009 | Kim et al. | 365/189.05 |
| 2011/0055671 | A1 * | 3/2011 | Kim et al. | 714/800 |

FOREIGN PATENT DOCUMENTS

| | | |
|---|---|---|
| JP | 2003043117 A | 2/2003 |
| KR | 1020060121711 A | 11/2006 |
| KR | 1020060135290 A | 12/2006 |
| KR | 1020080001861 A | 1/2008 |

* cited by examiner

*Primary Examiner* — Ly D Pham
(74) *Attorney, Agent, or Firm* — Volentine & Whitt, PLLC

(57) ABSTRACT

A semiconductor memory device comprises a variable delay unit and a data trainer. The variable delay unit is configured to generate a write data signal by delaying a write data driving signal by different amounts of time depending on whether the semiconductor memory device is in a data training mode or a normal operating mode, and further configured to generate a read data driving signal by delaying a read data signal by different amounts of time in the data training mode and the normal operating mode. The data trainer is configured to be activated in the data training mode, and while activated, receive the write data signal, compare the write data signal with a predetermined write pattern, perform a data training mode operation, and output the read data signal with a predetermined read pattern.

10 Claims, 7 Drawing Sheets

US 8,339,877 B2

SEMICONDUCTOR MEMORY DEVICE COMPRISING VARIABLE DELAY UNIT

CROSS-REFERENCE TO RELATED APPLICATIONS

This application claims priority under 35 U.S.C. §119 to Korean Patent Application No. 10-2009-0036037 filed on Apr. 24, 2009, the disclosure of which is hereby incorporated by reference in its entirety.

BACKGROUND

Embodiments of the inventive concept relate generally to a semiconductor memory device. More particularly, embodiments of the inventive concept relate to a semiconductor memory device capable of compensating for differences in data signal delays occurring in a data training mode of the device and those occurring in a normal operating mode of the device.

Data is transmitted between a semiconductor memory device and a memory controller in synchronization with a clock signal output by the memory controller. During these data transmissions, the relative timing of both the data signals and the clock signal may become skewed due to a number of factors such as interference between adjacent signal lines. To address these timing effects, data training operations may be performed on the relevant transmission pathways so that appropriate compensating adjustments can be made to the timing during normal operation of the semiconductor device. The data training may involve, for instance, characterization of the timing skew, including recognition of data patterns associated with certain types of skew, and development of compensation patterns.

Unfortunately, the operating environment or chip status in which the training is performed may be different from the normal operating environment or chip status of the semiconductor memory device. As a result, the compensation patterns developed during training may be different from those required under normal operating conditions. Accordingly, timing errors may arise when the compensation patterns are applied under normal operating conditions.

SUMMARY

Embodiments of the inventive concept provide a semiconductor memory device capable of compensating for a difference between a delay of data signals occurring when the semiconductor memory device performs a data training mode operation and a delay of data signals occurring when the semiconductor memory device performs a normal mode operation. Embodiments of the inventive concept further provide a memory system comprising such a semiconductor memory device.

According to one embodiment of the inventive concept, a semiconductor memory device, comprises a data input/output unit configured to receive an input data signal and output a write data driving signal, and further configured to receive a read data driving signal and output an output data signal. The device further comprises a variable delay unit configured to generate a write data signal by delaying the write data driving signal by different amounts of time depending on whether the semiconductor memory device is in a data training mode or a normal operating mode, and further configured to generate a read data driving signal by delaying a read data signal by different amounts of time in the data training mode and the normal operating mode. The device further comprises a data trainer configured to be activated in the data training mode, and while activated, receive the write data signal, compare the write data signal with a predetermined write pattern, perform a data training mode operation, and output the read data signal with a predetermined read pattern.

In certain embodiments, the semiconductor memory device further comprises a memory controller generating a data training signal to control whether the variable delay unit is in the data training mode or the normal operating mode.

In certain embodiments, the variable delay unit generates the write data signal by delaying the write data driving signal for a predetermined first delay and generates the read data driving signal by delaying the read data signal for a predetermined second delay in the data training mode operation, and generates the write data signal and the read data driving signal without delaying the write data driving signal and the read data signal in the normal operating mode.

In certain embodiments, the variable delay unit receives the write data driving signal and the read data signal and generates the write data signal and the read data driving signal without delaying the write data driving signal or the read data signal in the data training mode, and generates the write data signal by delaying the write data driving signal for a predetermined first delay and the read data driving signal by delaying the read data signal for a predetermined second delay in the normal operating mode.

In certain embodiments, the variable delay unit generates the write data signal by delaying the write data driving signal for a predetermined first training delay and the read data driving signal by delaying the read data signal for a predetermined second training delay in the data training mode, and generates the write data signal by delaying the write data driving signal for a predetermined first normal delay and the read data driving signal by delaying the read data signal for a predetermined second normal delay in the normal operating mode.

In certain embodiments, the variable delay unit comprises a delay setting unit configured to store and output a first delay setting value and a second delay setting value, and a delay unit comprising a write delay unit configured to generate the write data signal by delaying the write data driving signal for a first delay according to the first delay setting value in response to a data training signal, and a read delay unit configured to generate the read data driving signal by delaying the read data signal for a second delay according to the second delay setting value in response to the data training signal.

In certain embodiments, the variable delay unit comprises a delay setting unit configured to vary a first delay setting value and a second delay setting value in response to the data training signal and output the varied first and second delay setting values, and a delay unit having a write delay unit configured to generate the write data signal by delaying the write data driving signal for a first delay according to the varied first delay setting value, and a read delay unit configured to generate the read data driving signal by delaying the read data signal for a second delay according to the varied second delay setting value.

According to another embodiment of the inventive concept, a memory system comprises a semiconductor memory device comprising a data input/output unit configured to receive an input data signal and output a write data driving signal, and receive a read data driving signal and output an output data signal, a variable delay unit configured to generate a write data signal by delaying the write data driving signal for different times in a data training mode operation and a normal mode operation in response to a data training signal indicating whether or not the data training mode operation is to be performed, and further configured to receive a read data signal in response to the data training signal, and generate the read data driving signal by delaying the read data signal for different times in the data training mode operation and the normal mode operation, and a data trainer configured to be activated in response to the data training signal in the data training mode operation, receive the write data signal, compare the write data signal with a predetermined write pattern, perform the data training mode operation, and output the read data signal with a predetermined read pattern, and a memory controller configured to output the data training signal and the input data signal, and receive the output data signal.

In certain embodiments, the variable delay unit generates the write data signal by delaying the write data driving signal for a predetermined first delay and the read data driving signal by delaying the read data signal for a predetermined second delay in response to the data training signal being activated in the data training mode operation, and receives the write data driving signal and the read data signal and generates the write data signal and the read data driving signal without delaying the write data driving signal or the read data signal in response to the data training signal being deactivated in the normal mode operation.

In certain embodiments, the variable delay unit receives the write data driving signal and the read data signal and generates the write data signal and the read data driving signal without delaying the write data driving signal and the read data signal in response to the data training signal being activated in the data training mode operation, and generates the write data signal by delaying the write data driving signal for a predetermined first delay and the read data driving signal by delaying the read data signal for a predetermined second delay in response to the data training signal being deactivated in the normal mode operation.

In certain embodiments, the variable delay unit generates the write data signal by delaying the write data driving signal for a predetermined first training delay and the read data driving signal by delaying the read data signal for a predetermined second training delay in response to the data training signal being activated in the data training mode operation, and generates the write data signal by delaying the write data driving signal for a predetermined first normal delay and the read data driving signal by delaying the read data signal for a predetermined second normal delay in response to the data training signal being deactivated in the normal mode operation.

In certain embodiments, the variable delay unit comprises a delay setting unit configured to store and output a first delay setting value and a second delay setting value, and a delay unit comprising a write delay unit configured to generate the write data signal by delaying the write data driving signal for a first delay according to the first delay setting value in response to the data training signal, and a read delay unit configured to generate the read data driving signal by delaying the read data signal for a second delay according to the second delay setting value in response to the data training signal.

In certain embodiments, the variable delay unit comprises a delay setting unit configured to vary a first delay setting value and a second delay setting value in response to the data training signal and output the varied first and second delay setting values, and a delay unit comprising a write delay unit configured to generate the write data signal by delaying the write data driving signal for a first delay according to the varied first delay setting value, and a read delay unit config- ured to generate the read data driving signal by delaying the read data signal for a second delay according to the varied second delay setting value.

BRIEF DESCRIPTION OF THE DRAWINGS

Embodiments of the inventive concept will be more clearly understood from the following detailed description taken in conjunction with the accompanying drawings. In the drawings, like reference numerals denote like features.

DETAILED DESCRIPTION OF THE EMBODIMENTS

Various embodiments will be described more fully hereinafter with reference to the accompanying drawings. The inventive concept may, however, be embodied in many different forms and should not be construed as being limited to only the illustrated embodiments. Rather, these embodiments are presented as teaching examples.

Figure 1:
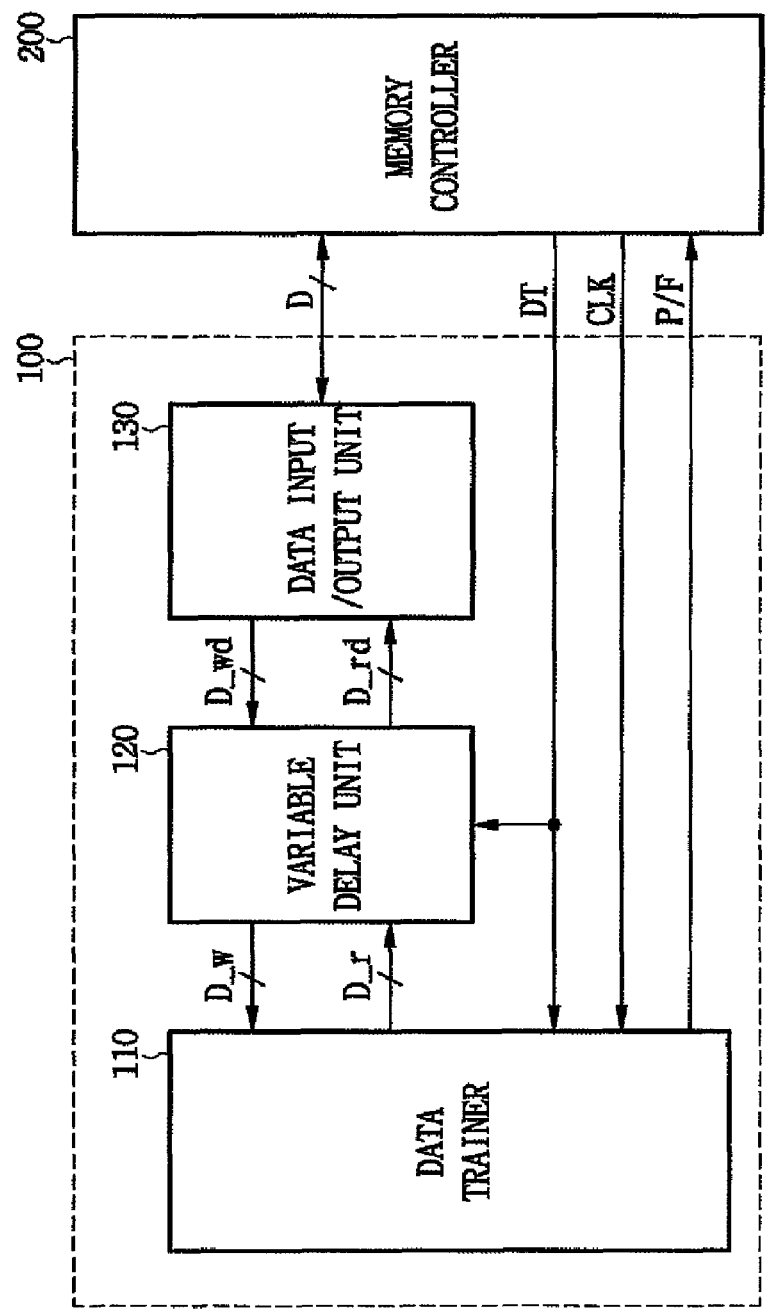
FIG. 1 is a block diagram illustrating a memory system according to an embodiment of the inventive concept.

FIG. 1 is a block diagram illustrating a memory system according to an embodiment of the inventive concept. The memory system comprises a semiconductor memory device 100 and a memory controller 200. Semiconductor memory device 100 comprises a data trainer 110, a variable delay unit 120, and a data input/output unit 130.

Data trainer 110 typically comprises a data input/output buffer and other features. Data trainer 110 performs a data training process while receiving write data signals D_w or outputting read data signals D_r in response to a data training signal DT generated by memory controller 200. In one example, data trainer 110 receives write data signals D_w input from variable delay unit 120 in response to data training signal DT, compares write data signals D_w with a stored data pattern and outputs a pass/fail signal P/F according to whether write data signals D_w are the same as the stored data pattern in a write data training operation. Data trainer 110 may also output a stored data pattern as read data signals D_r in a read data training operation.

Where semiconductor memory device 100 operates in a normal mode data training signal DT is deactivated, causing data training operations of data trainer 110 to be deactivated. In the normal operating mode, write data signals D_w are input to a memory cell array (not shown) through the data input/output buffer of data trainer 110. Alternatively, data stored in the memory cell array is output as read data signals D_r through the data input/output buffer.

Variable delay unit 120 delays a plurality of write data driving signals D_wd received from data input/output unit 130 for different times in data training mode operations and normal mode operations. Variable delay unit 120 outputs the delayed write data driving signals D_wd as write data signals D_w. Variable delay unit 120 may also delay read data signals D_r output from data trainer 110 for different times during data training mode operations and normal mode operations, outputting the delayed read data signals D_r as read data driving signals D_rd.

Data input/output unit 130 receives a plurality of data signals "D" output from memory controller 200 and outputs write data driving signals D_wd. Data input/output unit 130 also receives read data driving signals D_rd and outputs data signals D. Although not shown in the drawing, data input/output unit 130 may comprise on-die termination (ODT) circuits, off-chip drivers (OCDs), and so on.

Memory controller 200 outputs data training signal DT and data signals "D" to semiconductor memory device 100 and receives data signals "D" output from data input/output unit 130 of semiconductor memory device 100.

Figure 2:
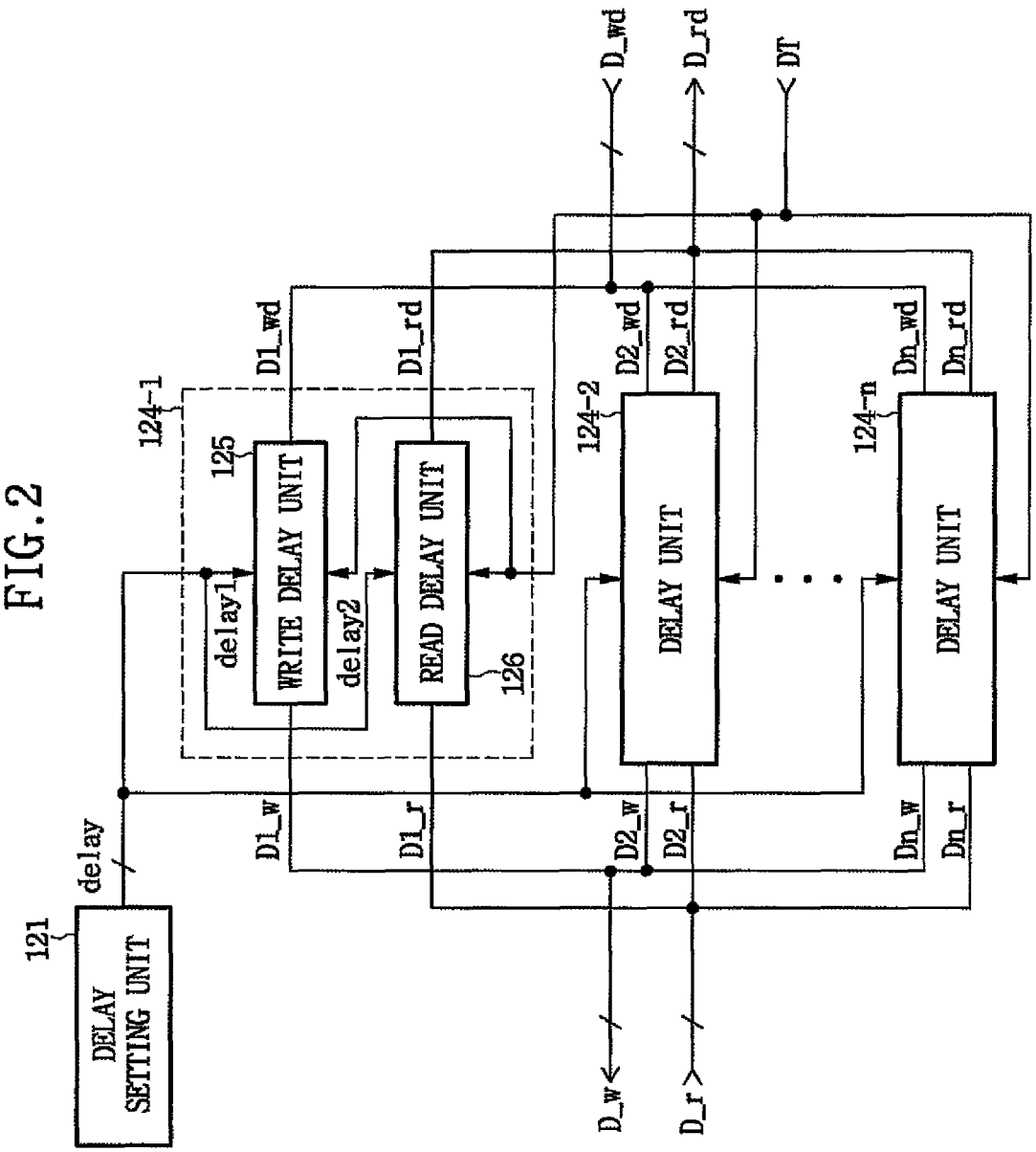
FIG. 2 is a block diagram illustrating a variable delay unit of the semiconductor memory device shown in FIG. 1 in accordance with an embodiment of the inventive concept.

FIG. 2 is a block diagram illustrating an embodiment of variable delay unit 120. In this embodiment, variable delay unit 120 comprises a delay setting unit 121 and a plurality of delay units 124-1 through 124-n each comprising a write delay unit 125 and a read delay unit 126.

Delay setting unit 121 outputs a stored delay setting value (labeled "delay"). The delay setting value may comprise a first delay setting value1 or a second delay setting value2. Further, delay setting unit 121 may comprise a mode register set (MRS), and so on.

In response to data training signal DT input from memory controller 200, each of delay units 124-1 through 124-n outputs a write data signal D1_w through Dn_w by delaying the corresponding write data driving signal D1_wd through Dn_wd according to the delay setting value. Alternatively, each of delay units 124-1 through 124-n outputs one of read data driving signals D1_rd through Dn_rd by delaying the corresponding read data signal D1_r through Dn_r according to the delay setting value.

Write delay unit 125 outputs one of write data signals D1_w through Dn_w by delaying the corresponding one of write data driving signals D1_wd to Dn_wd according to first delay setting value1 from delay setting unit 121 in response to data training signal DT output from memory controller 200.

Read delay unit 126 outputs one of read data driving signals D1_rd through Dn_rd by delaying the corresponding one of read data signals D1_r through Dn_r according to second delay setting value2 in response to data training signal DT.

For example, both write delay unit 125 and read delay unit 126 delay an input signal for a predetermined time according to first delay setting value1 or second delay setting value2 and output the delayed input signal when data training signal DT is activated. Alternatively, write delay unit 125 and read delay unit 126 output an input signal without delaying the input signal when data training signal DT is deactivated.

On the other hand, write delay unit 125 and read delay unit 126 may each output an input signal without delaying the input signal when data training signal DT is activated, and they may delay an input signal for a predetermined time according to first delay setting value1 or second delay setting value2 and output the delayed input signal when data training signal DT is deactivated. Otherwise, write delay unit 125 and read delay unit 126 may each delay an input signal for a predetermined normal delay and output the delayed input signal when data training signal DT is deactivated. They may also delay an input signal for a training delay that is longer or shorter than the normal delay by a predetermined time according to first delay setting value1 or second delay setting value2 and output the delayed input signal when data training signal DT is activated.

FIGS. 3 through 6 are timing diagrams illustrating the operation of variable delay unit 120 of semiconductor memory device 100 according to example embodiments. In FIGS. 3 through 6, an upper diagram labeled "(a)" shows the timing of data during a data training mode operation, and a lower diagram labeled "(b)" shows the timing of data during a normal mode operation. Also, in FIGS. 3 through 6, the label "Dk_wd" indicates a write data driving signal input to write delay unit 125 of a $k^{th}$ delay unit 124-k among delay units 124-1 through 124-n of variable delay unit 120. The label "Dk_w" indicates a write data signal output from write delay unit 125 of the $k^{th}$ delay unit 124-k among delay units 124-1 through 124-n of variable delay unit 120. The label "Data" indicates a data signal when semiconductor memory device 100 operates in the normal mode, and the label "CLK" indicates a clock signal output from memory controller 200. Write delay units 125 of respective delay units 124-1 through 124-n of variable delay unit 120 may operate in the same way as the illustrated delay unit 124-k.

The operation of variable delay unit 120 according to one embodiment will be described below with reference to FIGS. 3 through 6. As indicated above, this description explains the operation of delay unit 124-k. However, the operation of other delay units 124-1 through 124-n is similar to delay unit 124-k and therefore a description of each individual delay unit will be omitted to avoid redundancy.

Figure 3:
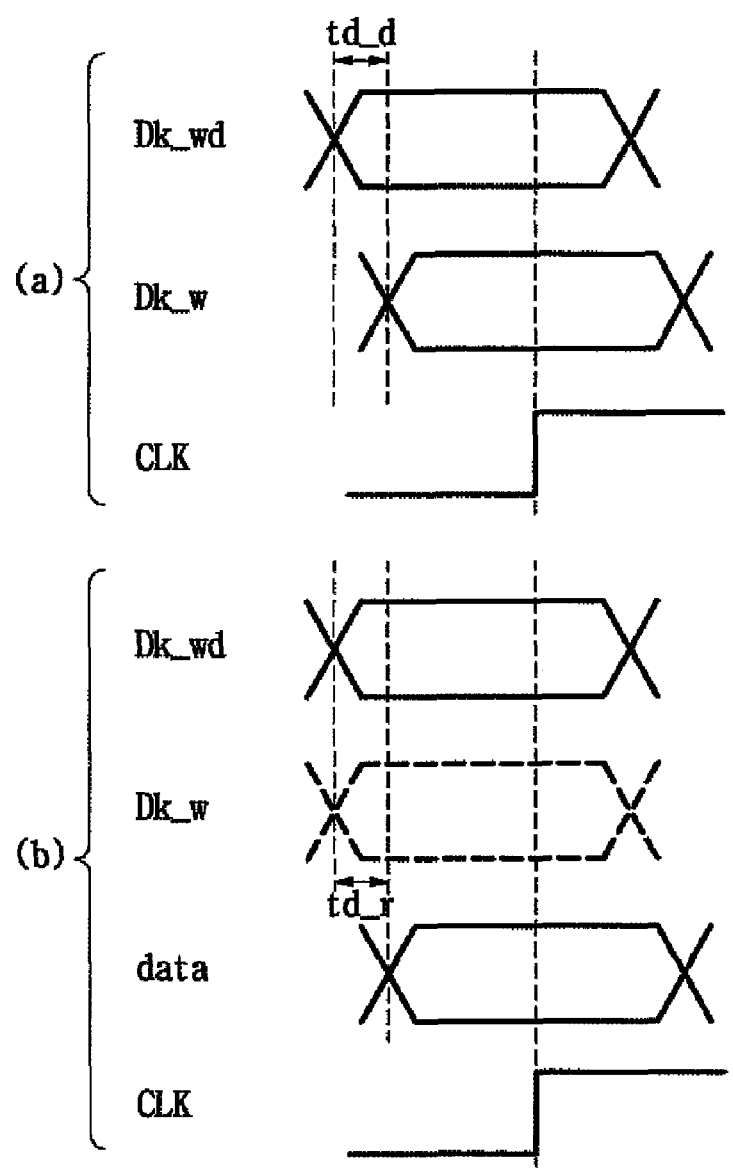
FIG. 3 is a timing diagram illustrating the operation of a variable delay unit of a semiconductor memory device according to an embodiment of the inventive concept.

FIG. 3 is a timing diagram illustrating operation of variable delay unit 120 in accordance with one embodiment. More specifically, FIG. 3 illustrates operation of variable delay unit 120 when a data signal is delayed by a greater amount in a normal mode operation of semiconductor memory device 100 than in a data training mode operation.

Referring to FIG. 3(*a*), in data training mode operation, write delay unit 125 of delay unit 124-k of variable delay unit 120 outputs a write data signal Dk_w by delaying an input write data driving signal Dk_wd for a predetermined time td_d, according to first delay setting value1, in response to activated data training signal DT. Delay td_d of write delay unit 125 may be set to the same time for which a data signal is delayed when semiconductor memory device 100 operates in the normal mode.

Data trainer 110 and memory controller 200 perform the data training process using write data signal Dk_w delayed by write delay unit 125. To be specific, the delay of a data signal is adjusted so that the center of write data signal Dk_w delayed by write delay unit 125 is disposed at the rising edge of a clock signal CLK.

Referring to FIG. 3(*b*), in the normal mode operation of semiconductor memory device 100, write delay unit 125 of delay unit 124-k outputs the input write data driving signal Dk_wd as write data signal Dk_w in response to deactivated data training signal DT without delaying the write data driving signal Dk_wd. However, where semiconductor memory device 100 operates in normal mode, a data signal is delayed for a predetermined time td_r according to an operating environment or chip status as described above, and thus write data signal Dk_w output from write delay unit 125 is delayed for the predetermined time td_r as the actual data signal data of semiconductor memory device 100 as shown in FIG. 3(B). As a result, the center of the data eye of the data signal data is disposed at the rising edge of clock signal CLK.

In other words, in the embodiment of FIG. 3, semiconductor memory device 100, according to the embodiment illustrated in FIG. 3, performs the data training operation in data training mode with a data signal delayed by variable delay unit 120 for a predetermined time td_r for which the data signal data is delayed when semiconductor memory device 100 actually operates. Additionally, semiconductor memory device 100 controls variable delay unit 120 not to delay write data signal Dk_w in normal mode, thereby removing a difference in data signal delay between data training operation and normal mode operation.

Figure 4:
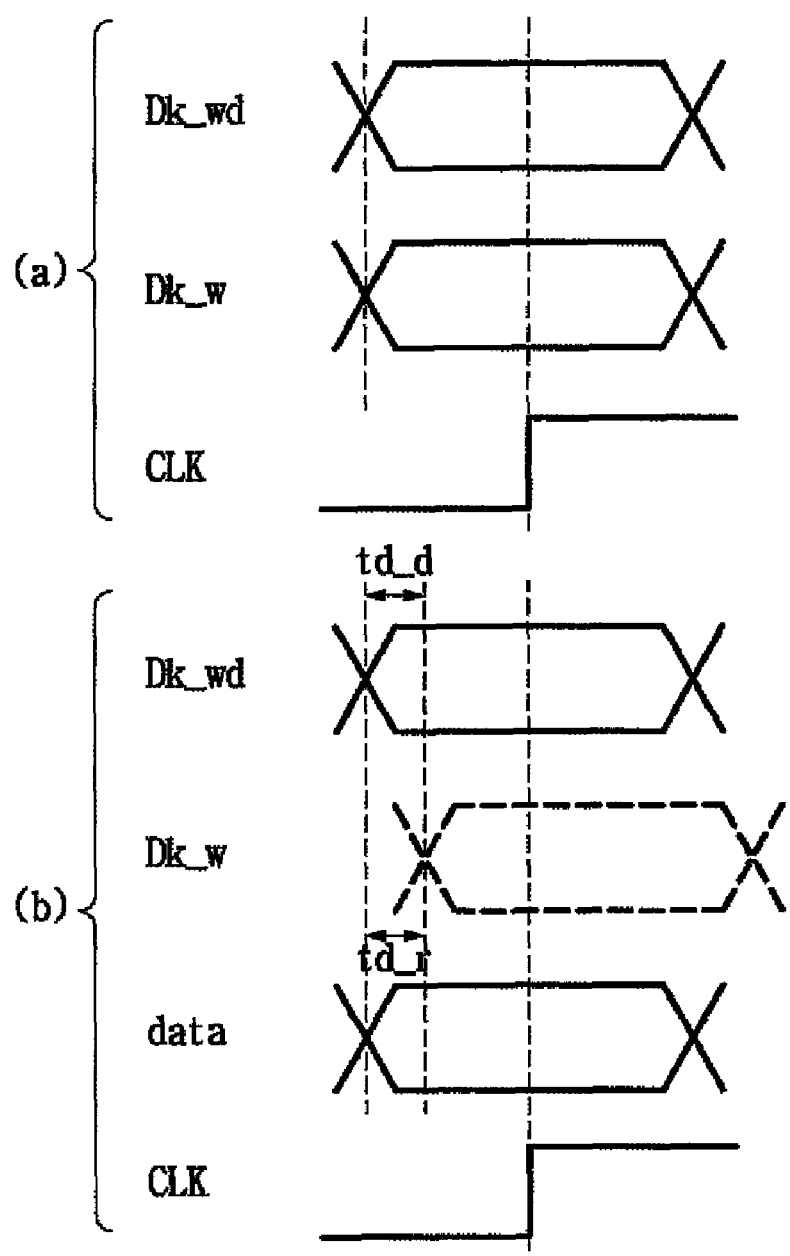
FIG. 4 is a timing diagram illustrating the operation of a variable delay unit of a semiconductor memory device according to another embodiment of the inventive concept.

FIG. 4 is a timing diagram illustrating the operation of variable delay unit 120 in accordance with another embodiment of the inventive concept. More specifically, FIG. 4 illustrates operation of variable delay unit 120 when a data signal is delayed by a greater amount during a data training mode operation than during a normal mode operation of semiconductor memory device 100. In other words, in the embodiment of FIG. 4, the data signal is advanced by a predetermined time in the normal mode operation by comparison with the data training mode operation.

Referring to FIG. 4(a), in data training mode operation, write delay unit 125 of delay unit 124-k of variable delay unit 120 outputs an input write data driving signal Dk_wd as a write data signal Dk_w without delaying the input write data driving signal Dk_wd in response to activated data training signal DT. Data trainer 110 and memory controller 200 perform the data training process using the non-delayed write data signal Dk_w.

Referring to FIG. 4(b), where semiconductor memory device 100 operates in normal mode, write delay unit 125 of delay unit 124-k outputs the write data signal Dk_w by delaying the input write data driving signal Dk_wd for a predetermined time td_d according to first delay setting value1 in response to the deactivated data training signal DT. The delay td_d of write delay unit 125 may be set to the same time as a difference in data signal delay between data training mode operation and normal mode operation of semiconductor memory device 100.

As described above, where semiconductor memory device 100 operates in the normal mode, a data signal may be advanced by a predetermined time td_r according to an operating environment or chip status. In other words, write data signal Dk_w delayed for predetermined time td_d by write delay unit 125 is advanced by predetermined time td_r as the actual data signal data of semiconductor memory device 100 as shown in FIG. 4(B). Thus, the timing of write data signal Dk_w is substantially centered on the rising edge of a clock signal CLK.

As indicated above, in the embodiment of FIG. 4, semiconductor memory device 100 comprises variable delay unit 120 that does not delay an input signal in response to the data training signal DT in the data training operation but does delay a data signal for the time td_r by which the signal is advanced when semiconductor memory device 100 operates in the normal mode in response to data training signal DT in normal mode operation. This scheme can remove a difference in data signal delay between data training operations and normal mode operations.

Figure 5:
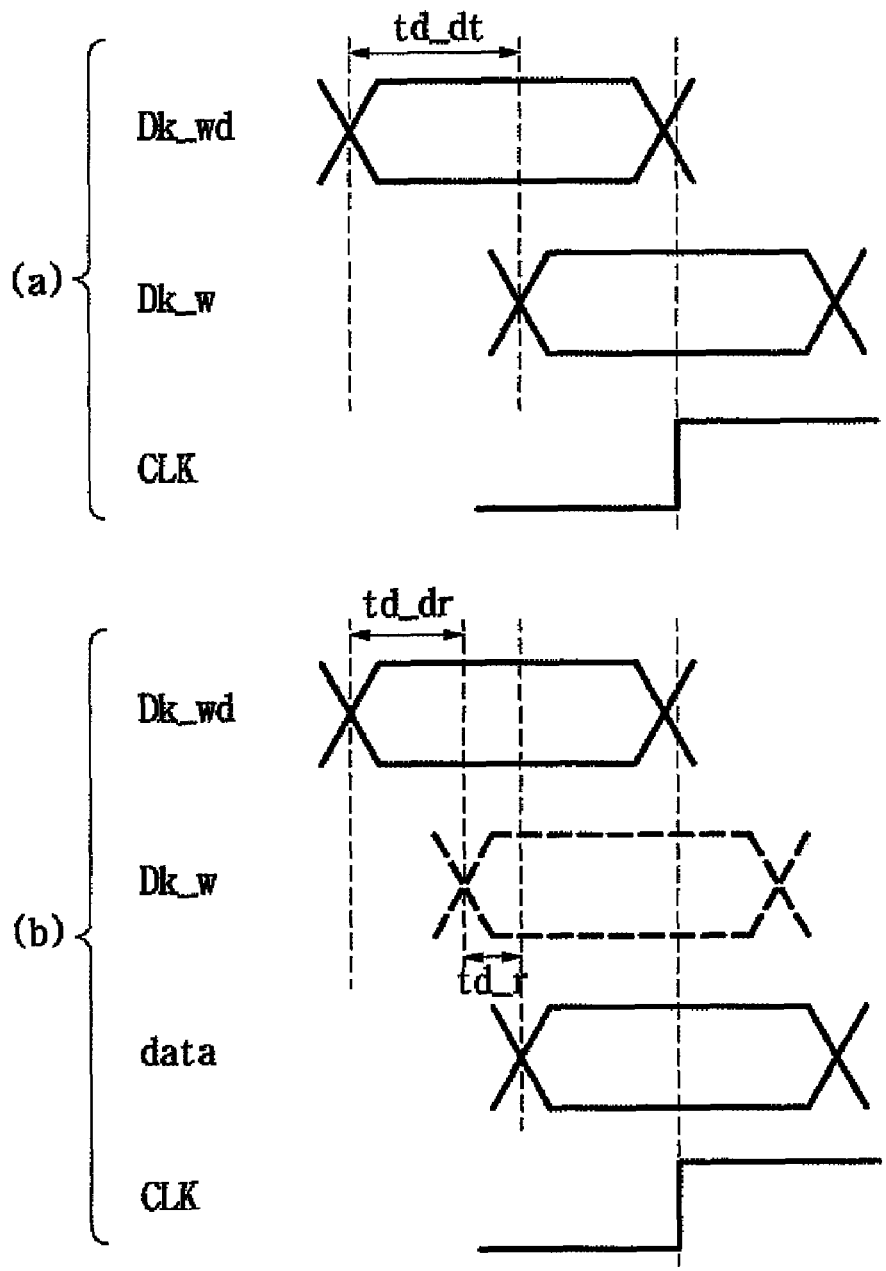
FIG. 5 is a timing diagram illustrating the operation of a variable delay unit of a semiconductor memory device according to still another embodiment of the inventive concept.

FIG. 5 is a timing diagram illustrating the operation of variable delay unit 120 according to still another embodiment of the inventive concept. In particular, FIG. 5 illustrates the operation of variable delay unit 120 where a data signal is delayed by a greater amount in the normal mode operation of semiconductor memory device 100 than in the data training mode operation.

Referring to FIG. 5(a), in data training mode operation, write delay unit 125 of delay unit 124-k in semiconductor memory device 100 outputs a write data signal Dk_w by delaying input write data driving signal Dk_wd for training delay td_d in response to activated data training signal DT. Data trainer 110 and memory controller 200 perform the data training process using write data signal Dk_w delayed by write delay unit 125.

Referring to FIG. 5(b), in normal mode operation, write delay unit 125 of delay unit 124-k of semiconductor memory device 100 outputs write data signal Dk_w by delaying input write data driving signal Dk_wd for a normal delay td_dr, which is shorter than training delay td_dt by a predetermined time, in response to deactivated data training signal DT. The predetermined time may be set to the same time as time td_r for which data is delayed in normal mode operation. However, where semiconductor memory device 100 operates in normal mode, a data signal is delayed for the predetermined time td_r according to an operating environment or chip status as described above, and thus the write data signal Dk_w delayed for a normal delay td_dr by write delay unit 125 is further delayed for a predetermined time td_r as the actual data signal data of semiconductor memory device 100 as shown in FIG. 5(b). As a result, the timing of the data signal centered on the rising edge of clock signal CLK.

In other words, in the embodiment of FIG. 5 variable delay unit 120 delays an input signal for the training delay td_dt in response to the data training signal DT in the data training operation, and delays an input signal for the normal delay td_dr, which is shorter than the training delay td_dt by the predetermined time td_r, in response to the data training signal DT in normal mode operation. Accordingly, this embodiment removes a difference in data signal delay between data training operation and normal mode operation.

Figure 6:
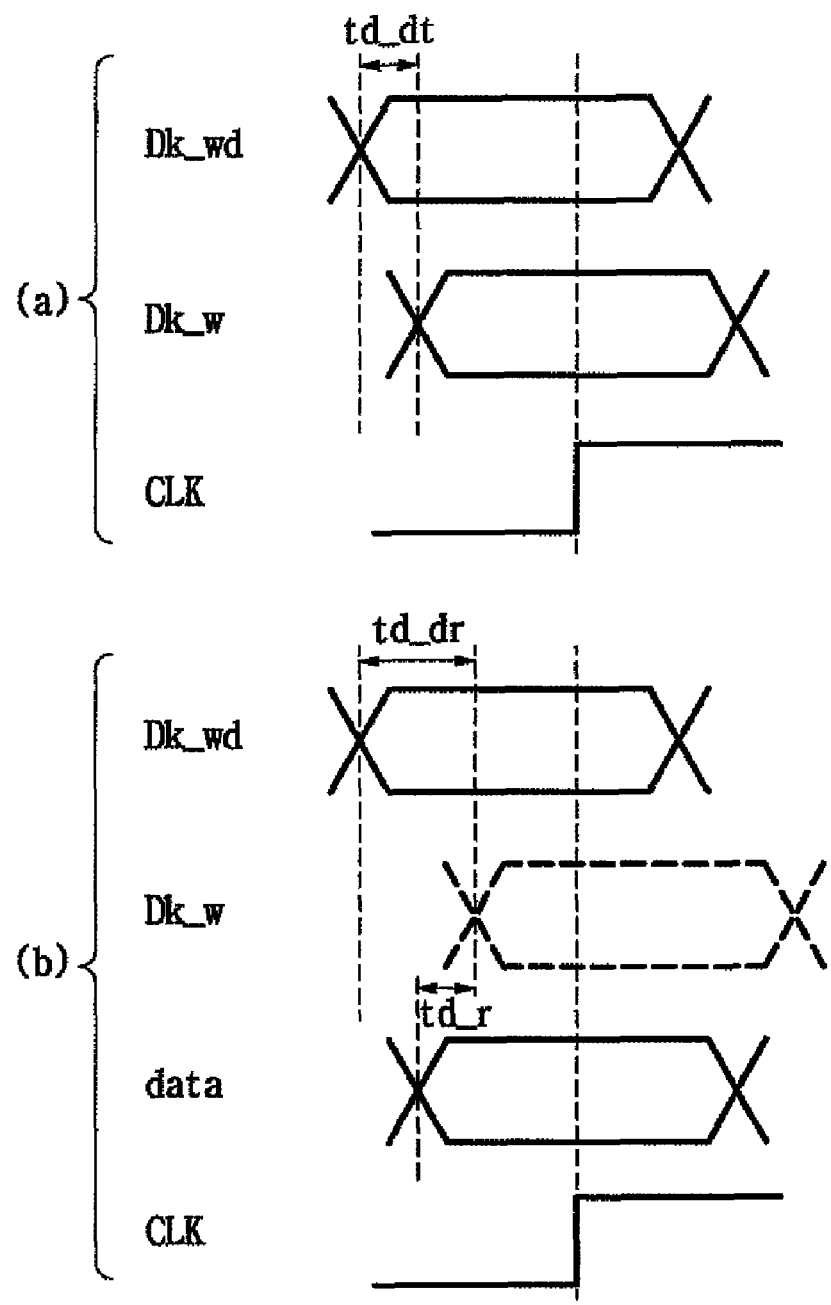
FIG. 6 is a timing diagram illustrating the operation of a variable delay unit of a semiconductor memory device according to yet another embodiment of the inventive concept.

FIG. 6 is a timing diagram illustrating the operation of variable delay unit 120 according to yet another embodiment of the inventive concept. In particular, FIG. 6 illustrates operation of variable delay unit 120 where a data signal is delayed by a greater amount in the data training mode operation than in the normal mode operation of semiconductor memory device 100. More specifically, in the example of FIG. 6, the data signal is advanced by a predetermined time td_r in the normal mode operation compared with the data training mode operation.

Referring to FIG. 6(a), in data training mode operation, write delay unit 125 of delay unit 124-k of semiconductor memory device 100 outputs a write data signal Dk_w by delaying an input write data driving signal Dk_wd for a training delay td_dt in response to activated data training signal DT. Data trainer 110 and memory controller 200 perform the data training process using the write data signal Dk_w delayed by write delay unit 125.

Referring to FIG. 6(b), in normal mode operation, write delay unit 125 of delay unit 124-k of semiconductor memory device 100 outputs write data signal Dk_w by delaying input write data driving signal Dk_wd for a normal delay td_dr, which is longer than the training delay td_dt by a predetermined time, in response to the deactivated data training signal DT. The predetermined time may be set to the same time as the time td_r by which data is advanced in normal mode operation.

However, where semiconductor memory device 100 operates in normal mode, a data signal may be advanced by the predetermined time td_r according to an operating environment or chip status. Thus, the write data signal Dk_w delayed for the normal delay td_dr by write delay unit 125 is advanced by the predetermined time td_r as the actual data signal data of semiconductor memory device 100 as shown in FIG. 6(*b*). Thus, the timing of the data signal is centered on the rising edge of clock signal CLK.

In other words, in the embodiment of FIG. 6, variable delay unit 120 delays an input signal for training delay td_dt in response to data training signal DT in the data training operation, and delays the input signal for normal delay td_dr, which is longer than the training delay td_dt, in response to the data training signal DT in the normal mode operation. This compensates for a difference in data signal delay between the data training operation and the normal mode operation of semiconductor memory device 100.

Although not shown in FIGS. 4 through 6, read delay unit 126 of each of delay units 124-1 through 124-n in variable delay unit 120 may operate in the same way as write delay unit 125. In such embodiments, the delay of read delay unit 126 may be set according to second delay setting value2 output from delay setting unit 121, and the delay of write delay unit 125 and the delay of read delay unit 126 may have different values.

Figure 7:
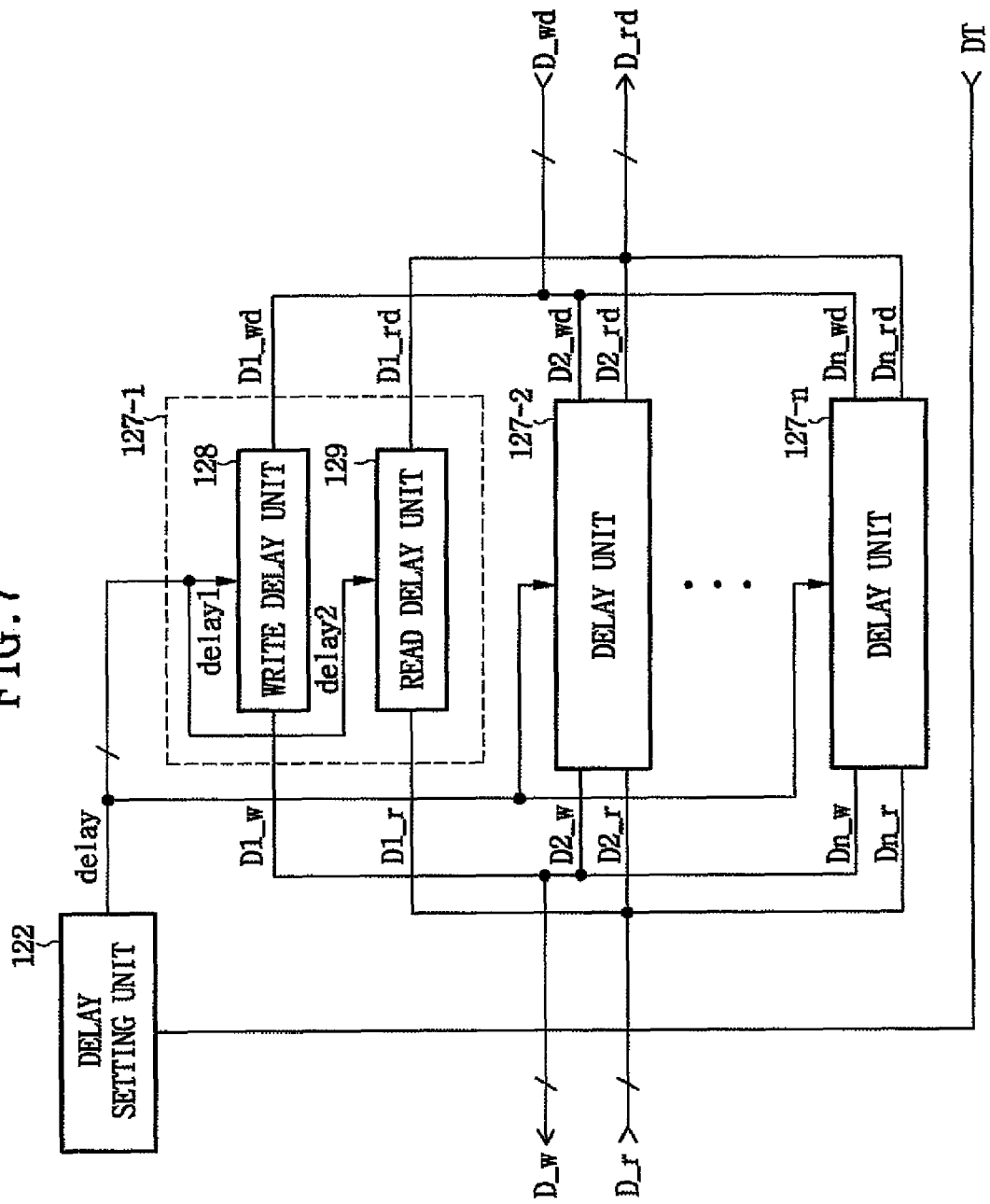
FIG. 7 is a block diagram illustrating a variable delay unit of the semiconductor memory device shown in FIG. 1 in accordance with another embodiment of the inventive concept.

FIG. 7 is a block diagram illustrating another embodiment of variable delay unit 120 of the semiconductor memory device shown in FIG. 1. In this embodiment, variable delay unit 120 comprises a delay setting unit 122 and a plurality of delay units 127-1 through 127-n each comprising a write delay unit 128 and a read delay unit 129.

Delay setting unit 122 outputs a delay setting value having different values in data training mode operation than in normal mode operation in response to data training signal DT output from memory controller 200. The delay setting value may consist of a first delay setting value1 and a second delay setting value2, and first delay setting value1 and second delay setting value2 may be different values. Also, delay setting unit 122 may include a MRS.

Each of delay units 127-1 through 127-n outputs one of write data signals D1_w through Dn_w by delaying one of corresponding write data driving signals D1_wd through Dn_wd according to the delay setting value. In the alternative, each of delay units 127-1 through 127-n outputs one of read data driving signals D1_rd through Dn_rd by delaying one of corresponding read data signals D1_r through Dn_r according to the delay setting value.

Write delay unit 128 outputs one of the write data signals D1_w through Dn_w by delaying one of corresponding write data driving signals D1_wd through Dn_wd according to first delay setting value1 of the delay setting value output from delay setting unit 122.

Read delay unit 129 outputs one of read data driving signals D1_rd through Dn_rd by delaying one of corresponding read data signal D1_r through Dn_r according to second delay setting value2 of the delay setting value.

In other words, in variable delay unit 120 of semiconductor memory device 100 according to the embodiment shown in FIG. 7, delay setting unit 122 outputs the delay setting value having different values in data training mode operation and than in normal mode operation in response to data training signal DT input from memory controller 200. Further, each of delay units 127-1 through 127-n delays an input signal for different times according to the delay setting value in data training mode operation and normal mode operation and output the delayed signal.

In other words, semiconductor memory device 100 according to certain embodiments comprises variable delay unit 120 delaying an input signal for different time increments in data training mode operation and in normal mode operation. Variable delay unit 120 outputs the delayed signal in response to data training signal DT, and thus can remove a difference between a data delay occurring in data training mode operation and a data delay occurring in normal mode operation.

As described above, a semiconductor memory device according to certain embodiments can compensate for a difference in a delay of data signals occurring when the semiconductor memory device performs a data training mode operation and a delay of data signals occurring when the semiconductor memory device performs a normal mode operation.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
   a data input/output unit configured to receive an input data signal and output a write data driving signal, and to receive a read data driving signal and output an output data signal;
   a variable delay unit configured to generate a write data signal by variably delaying the write data driving signal depending on whether the semiconductor memory device is in a data training mode or a normal operating mode, and to generate a read data driving signal by variably delaying a read data signal depending on whether the semiconductor memory device is in the data training mode and the normal operating mode; and
   a data trainer configured to receive the write data signal, compare the write data signal with a stored write pattern, perform a data training mode operation, and output the read data signal with a predetermined read pattern when activated in the data training mode,
   wherein the variable delay unit generates the write data signal by delaying the write data driving signal by a first delay and generates the read data driving signal by delaying the read data signal by a second delay during the data training mode operation, and generates the write data signal and the read data driving signal without delaying the write data driving signal and the read data signal during the normal operating mode.

2. A semiconductor memory device, comprising:
   a data input/output unit configured to receive an input data signal and output a write data driving signal, and to receive a read data driving signal and output an output data signal;
   a variable delay unit configured to generate a write data signal by variably delaying the write data driving signal depending on whether the semiconductor memory device is in a data training mode or a normal operating mode, and to generate a read data driving signal by variably delaying a read data signal depending on whether the semiconductor memory device is in the data training mode and the normal operating mode; and a data trainer configured to receive the write data signal, compare the write data signal with a stored write pattern, perform a data training mode operation, and output the read data signal with a predetermined read pattern when activated in the data training mode, wherein the variable delay unit receives the write data driving signal and the read data signal and generates the write data signal and the read data driving signal without delaying the write data driving signal or the read data signal during the data training mode, and generates the write data signal by delaying the write data driving signal by a first delay and the read data driving signal by delaying the read data signal by a second delay during the normal operating mode.

3. A semiconductor memory device, comprising:
a data input/output unit configured to receive an input data signal and output a write data driving signal, and to receive a read data driving signal and output an output data signal;
a variable delay unit configured to generate a write data signal by variably delaying the write data driving signal depending on whether the semiconductor memory device is in a data training mode or a normal operating mode, and to generate a read data driving signal by variably delaying a read data signal depending on whether the semiconductor memory device is in the data training mode and the normal operating mode; and
a data trainer configured to receive the write data signal, compare the write data signal with a stored write pattern, perform a data training mode operation, and output the read data signal with a predetermined read pattern when activated in the data training mode,
wherein the variable delay unit generates the write data signal by delaying the write data driving signal by a first training delay and the read data driving signal by delaying the read data signal by a second training delay during the data training mode, and generates the write data signal by delaying the write data driving signal by a first normal delay and the read data driving signal by delaying the read data signal by a second normal delay during the normal operating mode.

4. A semiconductor memory device, comprising:
a data input/output unit configured to receive an input data signal and output a write data driving signal, and to receive a read data driving signal and output an output data signal;
a variable delay unit configured to generate a write data signal by variably delaying the write data driving signal depending on whether the semiconductor memory device is in a data training mode or a normal operating mode, and to generate a read data driving signal by variably delaying a read data signal depending on whether the semiconductor memory device is in the data training mode and the normal operating mode;
a data trainer configured to receive the write data signal, compare the write data signal with a stored write pattern, perform a data training mode operation, and output the read data signal with a predetermined read pattern when activated in the data training mode;
a delay setting unit configured to store and output a first delay setting value and a second delay setting value; and
a delay unit comprising a write delay unit configured to generate the write data signal by delaying the write data driving signal by a first delay according to the first delay setting value in response to a data training signal, and a read delay unit configured to generate the read data driving signal by delaying the read data signal by a second delay according to the second delay setting value in response to the data training signal.

5. A semiconductor memory device, comprising:
a data input/output unit configured to receive an input data signal and output a write data driving signal, and to receive a read data driving signal and output an output data signal;
a variable delay unit configured to generate a write data signal by variably delaying the write data driving signal depending on whether the semiconductor memory device is in a data training mode or a normal operating mode, and to generate a read data driving signal by variably delaying a read data signal depending on whether the semiconductor memory device is in the data training mode and the normal operating mode;
a data trainer configured to receive the write data signal, compare the write data signal with a stored write pattern, perform a data training mode operation, and output the read data signal with a predetermined read pattern when activated in the data training mode;
a delay setting unit configured to vary a first delay setting value and a second delay setting value in response to a data training signal and output the varied first and second delay setting values; and
a delay unit having a write delay unit configured to generate the write data signal by delaying the write data driving signal by a first delay according to the varied first delay setting value, and a read delay unit configured to generate the read data driving signal by delaying the read data signal by a second delay according to the varied second delay setting value.

6. A memory system, comprising:
a semiconductor memory device comprising:
a data input/output unit configured to receive an input data signal and output a write data driving signal, and receive a read data driving signal and output an output data signal;
a variable delay unit configured to generate a write data signal by variably delaying the write data driving signal during a data training mode operation and a normal mode operation in response to a data training signal indicating a data training mode operation, and further configured to receive a read data signal in response to the data training signal, and generate the read data driving signal by variably delaying the read data signal during the data training mode operation and the normal mode operation; and
a data trainer configured to receive the write data signal, compare the write data signal with a predetermined write pattern, perform the data training mode operation, and output the read data signal with a predetermined read pattern during the data training mode operation,
wherein the variable delay unit generates the write data signal by delaying the write data driving signal by a first delay and the read data driving signal by delaying the read data signal by a second delay in response to the data training signal during the data training mode operation, and
receives the write data driving signal and the read data signal and generates the write data signal and the read data driving signal without delaying the write data driving signal or the read data signal in response to the data training signal being deactivated during the normal mode operation; and a memory controller configured to output the data training signal and the input data signal, and to receive the output data signal.

7. A memory system, comprising:
a semiconductor memory device comprising:
   a data input/output unit configured to receive an input data signal and output a write data driving signal, and receive a read data driving signal and output an output data signal;
   a variable delay unit configured to generate a write data signal by variably delaying the write data driving signal during a data training mode operation and a normal mode operation in response to a data training signal indicating a data training mode operation, and further configured to receive a read data signal in response to the data training signal, and generate the read data driving signal by variably delaying the read data signal during the data training mode operation and the normal mode operation; and
   a data trainer configured to receive the write data signal, compare the write data signal with a predetermined write pattern, perform the data training mode operation, and output the read data signal with a predetermined read pattern during the data training mode operation,
   wherein the variable delay unit receives the write data driving signal and the read data signal and generates the write data signal and the read data driving signal without delaying the write data driving signal and the read data signal in response to the data training signal being activated during the data training mode operation, and generates the write data signal by delaying the write data driving signal by a first delay and the read data driving signal by delaying the read data signal by a second delay in response to the data training signal being deactivated during the normal mode operation; and
a memory controller configured to output the data training signal and the input data signal, and to receive the output data signal.

8. A memory system, comprising:
a semiconductor memory device comprising:
   a data input/output unit configured to receive an input data signal and output a write data driving signal, and receive a read data driving signal and output an output data signal;
   a variable delay unit configured to generate a write data signal by variably delaying the write data driving signal during a data training mode operation and a normal mode operation in response to a data training signal indicating a data training mode operation, and further configured to receive a read data signal in response to the data training signal, and generate the read data driving signal by variably delaying the read data signal during the data training mode operation and the normal mode operation; and
   a data trainer configured to receive the write data signal, compare the write data signal with a predetermined write pattern, perform the data training mode operation, and output the read data signal with a predetermined read pattern during the data training mode operation,
   wherein the variable delay unit generates the write data signal by delaying the write data driving signal by a first training delay and the read data driving signal by delaying the read data signal by a second training delay in response to the data training signal being activated during the data training mode operation, and generates the write data signal by delaying the write data driving signal by a first normal delay and the read data driving signal by delaying the read data signal by a second normal delay in response to the data training signal being deactivated during the normal mode operation; and
a memory controller configured to output the data training signal and the input data signal, and to receive the output data signal.

9. A memory system, comprising:
a semiconductor memory device comprising:
   a data input/output unit configured to receive an input data signal and output a write data driving signal, and receive a read data driving signal and output an output data signal;
   a variable delay unit configured to generate a write data signal by variably delaying the write data driving signal during a data training mode operation and a normal mode operation in response to a data training signal indicating a data training mode operation, and further configured to receive a read data signal in response to the data training signal, and generate the read data driving signal by variably delaying the read data signal during the data training mode operation and the normal mode operation; and
   a data trainer configured to receive the write data signal, compare the write data signal with a predetermined write pattern, perform the data training mode operation, and output the read data signal with a predetermined read pattern during the data training mode operation,
   wherein the variable delay unit comprises:
      a delay setting unit configured to store and output a first delay setting value and a second delay setting value; and
      a delay unit comprising a write delay unit configured to generate the write data signal by delaying the write data driving signal by a first delay according to the first delay setting value in response to the data training signal, and a read delay unit configured to generate the read data driving signal by delaying the read data signal by a second delay according to the second delay setting value in response to the data training signal; and
a memory controller configured to output the data training signal and the input data signal, and to receive the output data signal.

10. A memory system, comprising:
a semiconductor memory device comprising:
   a data input/output unit configured to receive an input data signal and output a write data driving signal, and receive a read data driving signal and output an output data signal;
   a variable delay unit configured to generate a write data signal by variably delaying the write data driving signal during a data training mode operation and a normal mode operation in response to a data training signal indicating a data training mode operation, and further configured to receive a read data signal in response to the data training signal, and generate the read data driving signal by variably delaying the read data signal during the data training mode operation and the normal mode operation; and
   a data trainer configured to receive the write data signal, compare the write data signal with a predetermined write pattern, perform the data training mode operation, and output the read data signal with a predetermined read pattern during the data training mode operation, wherein the variable delay unit comprises:
  a delay setting unit configured to vary a first delay setting value and a second delay setting value in response to the data training signal and output the varied first and second delay setting values; and
  a delay unit comprising a write delay unit configured to generate the write data signal by delaying the write data driving signal by a first delay according to the varied first delay setting value, and a read delay unit configured to generate the read data driving signal by delaying the read data signal by a second delay according to the varied second delay setting value; and a memory controller configured to output the data training signal and the input data signal, and to receive the output data signal.

* * * * *